United States Patent
Shoji et al.

(10) Patent No.: US 6,693,863 B2
(45) Date of Patent: Feb. 17, 2004

(54) ASYMMETRY CORRECTING CIRCUIT AND INFORMATION REPRODUCING APPARATUS USING THE SAME

(75) Inventors: Norio Shoji, Kanagawa (JP); Yuji Gendai, Kanagawa (JP); Kimimasa Senba, Kanagawa (JP); Nobuyoshi Kobayashi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/122,329

(22) Filed: Apr. 16, 2002

(65) Prior Publication Data

US 2002/0172112 A1 Nov. 21, 2002

(30) Foreign Application Priority Data

Apr. 17, 2001 (JP) .................................. P2001-117967

(51) Int. Cl.[7] ................................................ G11B 7/00
(52) U.S. Cl. .............................. 369/47.35; 369/59.22; 369/47.17
(58) Field of Search ....................... 369/59.18, 58.31, 369/47.17, 124.05, 53.33, 59.22, 53.35, 47.35

(56) References Cited

U.S. PATENT DOCUMENTS 6,104,682 A * 8/2000 Konishi .................... 369/44.34

FOREIGN PATENT DOCUMENTS

| JP | 08-083403 | 3/1996 |
| JP | 09-134501 | 5/1997 |

* cited by examiner

Primary Examiner—Nabil Hindi
(74) Attorney, Agent, or Firm—Rader, Fishman & Grauer PLLC; Ronald P. Kananen

(57) ABSTRACT

To provide an asymmetry correcting circuit capable of canceling an asymmetry simultaneously with quantization in an ADC and utilizing the dynamic range of the ADC effectively, and also to provide an information reproducing apparatus using such a correcting circuit. An asymmetry correcting circuit includes a first envelope detection circuit for detecting the envelope of a positive peak of an input signal waveform; a second envelope detection circuit for detecting the envelope of a negative peak of the input signal waveform; an adding circuit for producing a sum voltage of the positive peak voltage and the negative peak voltage; a smoothing circuit for smoothing the sum voltage; a multiplying circuit for multiplying the smoothed sum voltage by a predetermined offset adjustment coefficient; and a quantization reference voltage control circuit for DC-wise shifting, in response to the output signal of the multiplying circuit, the median of the quantization reference voltage of the ADC in conformity with the offset derived from the asymmetry of the input signal, and controlling the upper limit and the lower limit of the quantization reference voltage to the values that correspond to the offset quantity.

26 Claims, 3 Drawing Sheets

ASYMMETRY CORRECTING CIRCUIT AND INFORMATION REPRODUCING APPARATUS USING THE SAME

BACKGROUND OF THE INVENTION

The present invention relates to an asymmetry correcting circuit adapted for correction of a vertically asymmetric distortion (asymmetry) of a read waveform generated in a read mode in a digital recording/reproducing apparatus, such as an optical disk apparatus or the like, and also to a recording/reproducing apparatus using such an asymmetry correcting circuit.

In the conventional hard disk devices (HDD) and the like known heretofore, a variety of methods have been contrived for correcting a nonlinear distortion of a read amplifier connected to a magnetoresistance (MR) type head, and such methods are classified broadly into the following three.

The first is a method of canceling the distortion of a read signal by detecting an asymmetry quantity from analog or sampling data, and then feeding back the detected quantity to a bias current of the MR element.

The second is a method of correcting the distortion by subtracting the secondary component of the analog signal. The quantity to be corrected is adjusted by detecting the distortion quantity and forming a negative feedback loop.

The third is a method carried out by detecting the distortion of sampling data and canceling the distortion through digital operation. In this case, there are required a correction quantity detection circuit and a negative feedback loop.

Generation of such asymmetry in an optical disk apparatus is derived from the phenomenon that the length and the width of optical pits recorded on the surface of an optical disk are deviated from reference values by, for example, some variation in the optical power of a laser beam splitter in a recording mode.

In another case where signals are recorded on a single optical disk by a plurality of different recording apparatus, the dimensions of pits recorded on the optical disk are changed, with regard to the same data, due to variations in the performance of the individual recording apparatus, so that when the disk is played continuously, the amplitudes of the reproduced signals are varied to consequently generate some asymmetry in the reproduced signals.

Thus, in the case of an optical disk, nonlinear distortion is generated by variation in a writing power and the medium is replaceable, so that the distortion quantity is changed in each sector (segment), even on the same disk, whereby it is rendered necessary to absorb such variation in a short time within the period of a VFO (training pattern).

For correction of such asymmetry in an optical disk apparatus, adopting any of the first to third methods mentioned above is considered undesirable due to the following reasons.

The first method is restricted merely to an MR read amplifier, and it is not usable in case the factors of generating a distortion are different as in an optical disk.

In the second method, a circuit for correction of the signal is required, and there exists a possibility that some distortion and noise are additionally generated by such a correcting circuit.

Regarding a method for correction of a secondary distortion, an example of subtracting the square component of the signal from its original signal is disclosed in Japanese Patent Laid-open No. Hei 9-134501.

In this method, however, there is known a disadvantage that a tertiary distortion is worsened. Since the DC (direct current) offset of the output signal is varied by the action of the circuit, there arises another problem, when a fast action is needed, with respect to the offset absorption time in an AC (alternating current) coupler provided in the following stage.

In the third method that feeds back the correction quantity through a digital operation after quantization, the gain is limited due to generation of a long loop delay, whereby it is rendered impossible to establish the correction quantity in a short time.

As for the correction method including a digital operation, it is a premise that a PLL (phase-locked loop) is locked to the input signal. Therefore, in case the input signal has a great asymmetry or offset, there exists a possibility that the PLL fails to be locked and consequently the loop breaks down.

Another method is proposed, for example, in Japanese Patent Laid-open No. Hei 8-83403, wherein the median VRC of the quantization reference voltage of an analog-to-digital converter (hereinafter referred to as ADC) is changed, in conformity with the asymmetry of the input signal, to the upper limit VRT and the lower limit VRB of the quantization reference voltage, hence changing the quantization resolutions on the upper and lower sides to eventually cancel the vertical asymmetry of the input signal.

However, the DVR (Digital Video Recorder) system has data of two values on each of the upper and lower sides (four values of ±1 and ±2 in total), wherein the ±1 levels are not changed substantially by the asymmetry while the ±2 levels are affected much.

Consequently, it is impossible by the above method to realize effective elimination of the asymmetry by changing only the median VRC of the quantization reference voltage.

Further, since the maximum amplitude of the signal is increased by the asymmetry, there may occur a phenomenon that the amplitude is raised out of the dynamic range of the ADC.

SUMMARY OF THE INVENTION

The present invention has been accomplished in view of the circumstances described above. And an object of the invention is to provide an improved asymmetry correcting circuit and an information reproducing apparatus using such a correcting circuit, wherein, when a read signal is processed in a digital recording/reproducing apparatus, the quantization reference level of an ADC for converting the input signal into a digital signal can be changed asymmetrically in accordance with the vertically asymmetric quantity (asymmetry) of the input waveform, the asymmetry can be canceled out simultaneously with the quantization, and further the dynamic range of the ADC can be utilized effectively.

According to the first aspect of the present invention, there is provided an asymmetry correcting circuit for correcting a vertically asymmetric distortion of an input signal waveform in an analog-to-digital converter which quantizes the input signal waveform in accordance with a quantization reference voltage and converts the quantized waveform into a digital signal of predetermined bits, the asymmetry correcting circuit including:

a first envelope detection circuit for detecting the envelope of a positive peak of the input signal waveform;

a second envelope detection circuit for detecting the envelope of a negative peak of the input signal waveform;

an adding circuit for outputting a sum voltage of the positive peak voltage obtained from the first envelope detection circuit and the negative peak voltage obtained from the second envelope detection circuit;

a multiplying circuit for multiplying the sum voltage, which is outputted from the adding circuit, by a predetermined offset adjustment coefficient; and a quantization reference voltage control circuit for shifting, in response to the output signal of the multiplying circuit, the median of the quantization reference voltage of the analog-to-digital converter DC-wise in conformity with the offset derived from the asymmetry of the input signal, and controlling the upper limit and the lower limit of the quantization reference voltage to the values that correspond to the offset quantity.

According to the second aspect of the present invention, there is provided an asymmetry correcting circuit for correcting a vertically asymmetric distortion of an input signal waveform in an analog-to-digital converter which quantizes the input signal waveform in accordance with a quantization reference voltage and converts the quantized waveform into a digital signal of predetermined bits, the asymmetry correcting circuit including:

a first envelope detection circuit for detecting the envelope of a positive peak of the input signal waveform;

a second envelope detection circuit for detecting the envelope of a negative peak of the input signal waveform;

an adding circuit for outputting a sum voltage of the positive peak voltage obtained from the first envelope detection circuit and the negative peak voltage obtained from the second envelope detection circuit;

a smoothing circuit for smoothing the sum voltage obtained from the adding circuit;

a multiplying circuit for multiplying the smoothed sum voltage, which is obtained from the smoothing circuit, by a predetermined offset adjustment coefficient; and a quantization reference voltage control circuit for shifting, in response to the output signal of the multiplying circuit, the median of the quantization reference voltage of the analog-to-digital converter DC-wise in conformity with the offset derived from the asymmetry of the input signal, and controlling the upper limit and the lower limit of the quantization reference voltage to the values that correspond to the offset quantity.

According to the third aspect of the present invention, there is provided an information reproducing apparatus for reproducing, as digital data, information recorded optically on an optical recording medium, including:

an optical reading means for optically reading, from the optical recording medium, a signal corresponding to the recorded information;

an analog-to-digital converter for quantizing the read signal waveform, which is obtained from the optical reading means, in accordance with a quantization reference voltage whose at least upper and lower limits are settable to desired values, and converting the quantized waveform into a digital signal of predetermined bits; and an asymmetry correcting circuit including:

a first envelope detection circuit for detecting the envelope of a positive peak of the read signal waveform;

a second envelope detection circuit for detecting the envelope of a negative peak of the read signal waveform;

an adding circuit for outputting a sum voltage of the positive peak voltage obtained from the first envelope detection circuit and the negative peak voltage obtained from the second envelope detection circuit;

a multiplying circuit for multiplying the sum voltage, which is outputted from the adding circuit, by a predetermined offset adjustment coefficient; and a quantization reference voltage control circuit for shifting, in response to the output signal of the multiplying circuit, the median of the quantization reference voltage of the analog-to-digital converter DC-wise in conformity with the offset derived from the asymmetry of the read signal, and controlling the upper limit and the lower limit of the quantization reference voltage to the values that correspond to the offset quantity;

wherein the asymmetry correcting circuit is capable of correcting a vertically asymmetric distortion of the read signal waveform in the analog-to-digital converter.

According to the fourth aspect of the present invention, there is provided an information reproducing apparatus for reproducing, as digital data, information recorded optically on an optical recording medium, including:

an optical reading means for optically reading, from the optical recording medium, a signal corresponding to the recorded information;

an analog-to-digital converter for quantizing the read signal waveform, which is obtained from the optical reading means, in accordance with a quantization reference voltage whose at least upper and lower limits are settable to desired values, and converting the quantized waveform into a digital signal of predetermined bits; and an asymmetry correcting circuit including:

a first envelope detection circuit for detecting the envelope of a positive peak of the read signal waveform;

a second envelope detection circuit for detecting the envelope of a negative peak of the read signal waveform;

an adding circuit for outputting a sum voltage of the positive peak voltage obtained from the first envelope detection circuit and the negative peak voltage obtained from the second envelope detection circuit;

a smoothing circuit for smoothing the sum voltage obtained from the adding circuit;

a multiplying circuit for multiplying the smoothed sum voltage, which is outputted from the smoothing circuit, by a predetermined offset adjustment coefficient; and a quantization reference voltage control circuit for shifting, in response to the output signal of the multiplying circuit, the median of the quantization reference voltage of the analog-to-digital converter DC-wise in conformity with the offset derived from the asymmetry of the read signal, and controlling the upper limit and the lower limit of the quantization reference voltage to the values that correspond to the offset quantity;

wherein the asymmetry correcting circuit is capable of correcting a vertically asymmetric distortion of the read signal waveform in the analog-to-digital converter.

According to the present invention, the read signal outputted from the optical read means is processed by the AC connection means so that the DC component of the signal is removed, and then the read signal is supplied to the asymmetry correcting circuit and the ADC.

The read signal thus supplied to the asymmetry correcting circuit is inputted to the first and second envelope detection circuits.

In the first envelope detection circuit, there is detected the envelope of the positive peak of the read signal waveform where the DC component has been removed, and then the detected envelope is outputted to the adding circuit.

Meanwhile in the second envelope detection circuit, there is detected the envelope of the negative peak of the read signal waveform where the DC component has been removed, and then the detected envelope is outputted to the adding circuit.

Subsequently in the adding circuit, a sum voltage is produced by adding the positive peak voltage obtained from the first envelope detection circuit and the negative peak voltage obtained from the second envelope detection circuit, and the sum voltage is outputted to the smoothing circuit.

Thereafter, in the smoothing circuit, the sum voltage obtained from the adding circuit is smoothed and then is outputted to the multiplying circuit.

Here, to cancel the asymmetric distortion of the signal and also to render the PLL circuit lockable for example, a process is executed for attaining a coincidence between the original zero crossing point of the input signal (read signal) and the zero reference voltage VRC of the ADC.

More specifically, the output signal of the smoothing circuit is multiplied by a desired coefficient in the multiplying circuit, and the result is supplied to the quantization reference voltage control circuit.

Then, in the quantization reference voltage control circuit supplied with the signal multiplied by the coefficient, the output signal of the multiplying circuit is subtracted from the bias voltage of the ADC, whereby the zero reference voltage VRC of the ADC is adjusted.

Feedback is applied in such a manner that, for example, the zero reference voltage VRC coincides with the bias voltage V of the ADC, and the offset is adjusted by the first adjusting circuit.

Meanwhile, in the second adjusting circuit, the output signal of the multiplying circuit is multiplied by a coefficient ASYMGT conforming with the correlation between the offset quantity of the read signal (input signal) and the asymmetric distortion quantity thereof, whereby a first adjustment quantity is produced, then the upper limit VRT of the quantization reference voltage is adjusted on the basis of the first adjustment quantity, and the adjusted upper limit VRT is supplied to the ADC.

In the third adjusting circuit, the output signal of the multiplying circuit is multiplied by a coefficient ASYMGB conforming with the correlation between the offset quantity of the read signal (input signal) and the asymmetric distortion quantity thereof, whereby a second adjustment quantity is produced, then the lower limit VRB of the quantization reference voltage is adjusted on the basis of the second adjustment quantity, and the adjusted lower limit VRB is supplied to the ADC.

In the ADC where the bias voltage is applied, the input signal is quantized in accordance with the quantization reference voltage supplied from the quantization reference voltage generating circuit in the asymmetry correcting circuit, then the signal is converted into digital data of predetermined bits, and the digital data is outputted to the data processing circuit.

In the data processing circuit, a predetermined process of equalization is executed by, e.g., an equalizer with regard to the digital data obtained from the ADC, and then the data after such equalization is decoded by a Viterbi decoder.

Also in the data processing circuit, after the PLL circuit is phase-locked, for example, the offset error and the asymmetry error relative to a desired expected value are detected on the basis of the digital data, and correction signals for canceling out such errors are fed back, so that the offset and the asymmetry of the input signal are corrected with high precision.

Thus, the ADC is employed to digitize the input signal when processing the read signal in the reproducing apparatus, wherein the quantization reference level of the ADC is changed asymmetrically in accordance with the vertically asymmetric distortion (hereinafter referred to as asymmetry) of the input waveform. Consequently, the asymmetry can be canceled simultaneously with the quantization, and the dynamic range of the ADC can be utilized effectively.

In other words, the asymmetry correcting circuit of the present invention is characterized by extraction of the correction quantity from the input analog signal of the ADC through processing the analog signal, and also by feed-forward of the extracted control quantity to the quantization reference value of the ADC, hence realizing a fast action of the correcting circuit and exact correction of the asymmetry without the necessity of locking the PLL.

Moreover, the upper limit VRT and the lower limit VRB of the quantization reference voltage of the ADC are controlled independently of each other with respect to ±1 data reference values after sampling (e.g., ±8 LSB of a 6-bit ADC in a DVR system), thereby attaining effective elimination of the asymmetry in the DVR system.

The above and other objects, features and advantages of the present invention will become apparent from the following description and the appended claims, taken in conjunction with the accompanying drawings in which like parts or elements are denoted by like reference symbols.

DETAILED DESCRIPTION OF THE PREFERRED EMBODIMENT

Figure 1:
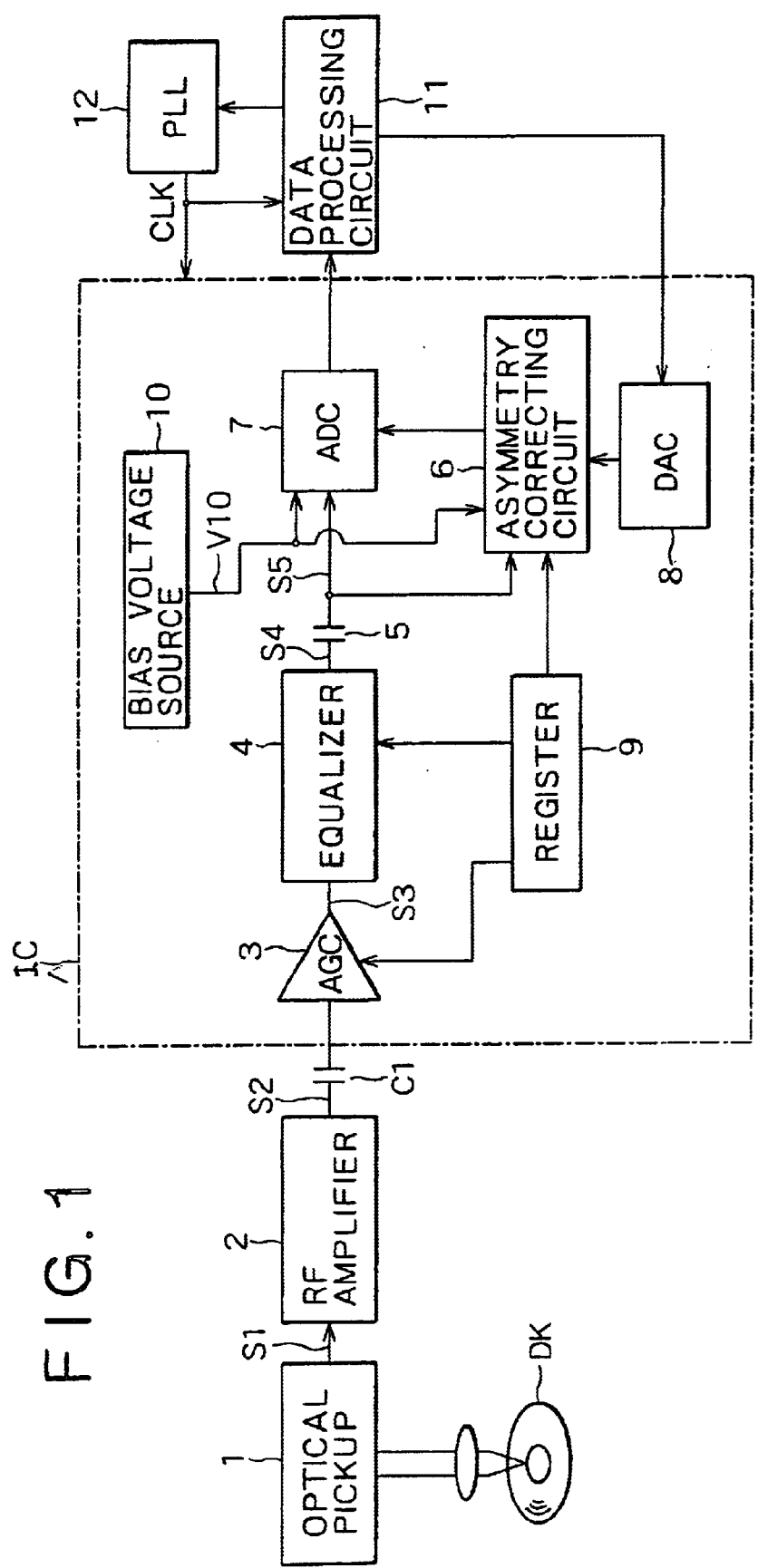
FIG. 1 is a block diagram showing an embodiment of an optical disk apparatus which represents a recording/reproducing apparatus where an asymmetry correcting circuit of the present invention is employed.

FIG. 1 is a block diagram showing a preferred embodiment of an optical disk apparatus which represents a recording/reproducing apparatus using the asymmetry correcting circuit of the present invention.

As shown in FIG. 1, the optical disk apparatus includes, as main component elements thereof, an optical pickup 1 serving as an optical read means, an RF amplifier 2, an automatic gain controller (AGC) 3, an equalizer 4, a capacitor 5 serving as an AC (alternating current) connection means, an asymmetry correcting circuit 6, an ADC (analog-to-digital converter) 7, a digital-to-analog converter (hereinafter referred to as DAC) 8 as a feedback circuit, a register 9, a bias voltage source 10 for the ADC, a data processing circuit 11, and a PLL circuit 12.

In this diagram, DK denotes an optical disk which is an optical recording medium.

In these component elements, for example, the AGC 3, the equalizer (equalizing circuit) 4, the capacitor 5, the asymmetry correcting circuit 6, the ADC 7, the DAC 8, the register 9 and the bias voltage source 10 are integrated to constitute a single chip IC.

The optical pickup 1 irradiates a laser beam to a desired position of the optical disk DK to thereby read out the recorded information, then converts the information into an electric signal, and outputs the read signal S1 to the RF amplifier 2.

The RF amplifier 2 executes a process of amplifying the read signal S1 obtained from the optical pickup 1, and outputs the processed read signal S2 to the AGC 3 via the AC-coupling capacitor C1.

The AGC 3 controls, in accordance with the stored information in the register 9, for example, the amplitude of the AC-coupled read signal S2 from which the DC component thereof has been removed through the capacitor C1, and then outputs the controlled read signal S3 to the equalizer 4.

The equalizer 4 executes a predetermined process of equalizing the read signal S3 while eliminating any high frequency noise therefrom, and then outputs the processed read signal S4.

The capacitor 5 removes the DC component of the read signal S4 obtained from the equalizer 4, and supplies the AC component thereof as a read signal S5 to both the asymmetry correcting circuit 6 and the ADC 7.

In response to the read signal S5 and a bias voltage V10 supplied from the bias voltage source 10, the asymmetry correcting circuit 6 shifts the median VRC of the quantization reference voltage of the ADC 6 DC-wise in accordance with the offset generated due to the asymmetry of the read signal S5, and controls the upper limit VRT and the lower limit VRC of the quantization reference voltage in accordance with the detected offset quantity, thereby correcting (compensating) the asymmetry of the input signal at the time of quantization.

In other words, the asymmetry correcting circuit 6 corrects, at the time of quantization, the vertically asymmetric distortion of the input signal waveform in the ADC 7.

Figure 2:
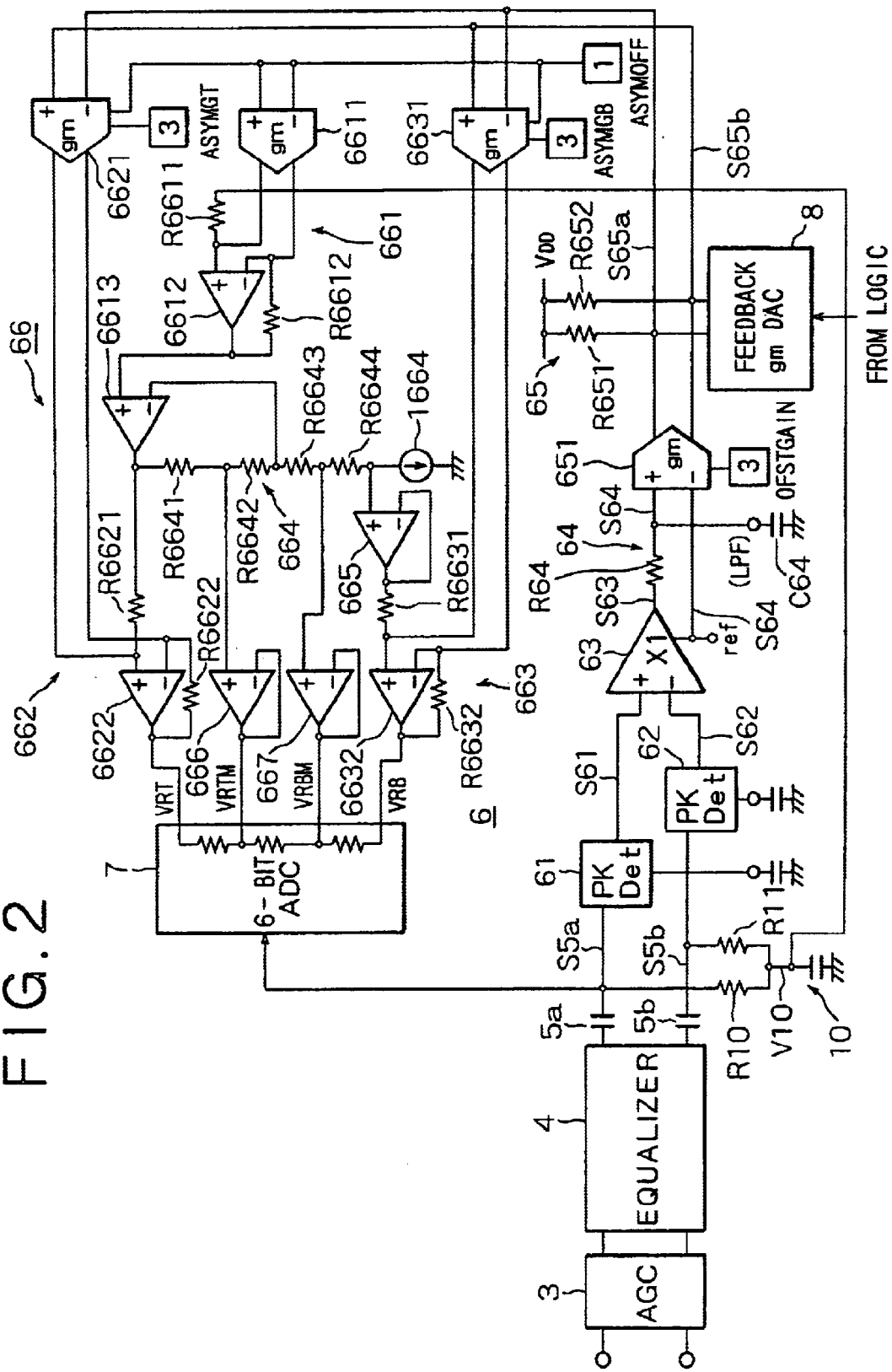
FIG. 2 is a circuit diagram showing a concrete structural example of the asymmetry correcting circuit of the present invention.

FIG. 2 is a circuit diagram showing a concrete structural example of the asymmetry correcting circuit 6 of the present invention.

For this circuit, an explanation will be given on the assumption that the read signal is a differential signal.

It is supposed here that the circuit is used in a DVR system. In this DVR system, there are data of two values on each of the upper and lower sides (four values of ±1 and ±2 in total) with regard to the median VRC of the quantization reference voltage of the ADC 7, wherein the ±1 levels are not changed substantially by the asymmetry while the ±2 levels are affected much.

As shown in FIG. 2, the asymmetry correcting circuit 6 includes a first envelope detection circuit 61, a second envelope detection circuit 62, an adding circuit 63, a smoothing circuit 64, a multiplying circuit 65, and a quantization reference voltage control circuit 66.

The first envelope detection circuit 61 functions in response to a bias voltage received from a bias voltage source 10 via a resistance element R10, detects the envelope of a positive peak of a read signal waveform (input signal waveform) from which the DC component thereof has been removed through a capacitor 5a, and then outputs the detected envelope as a signal S61 to the adding circuit 63.

The second envelope detection circuit 62 functions in response to a bias voltage received from the bias voltage source 10 via a resistance element R11, detects the envelope of a negative peak of the read signal waveform (input signal waveform) from which the DC component thereof has been removed through a capacitor 5b, and then outputs the detected envelope as a signal S62 to the adding circuit 63.

The adding circuit 63 produces a sum voltage of the positive peak voltage obtained from the first envelope detection circuit 61 and the negative peak voltage obtained from the second envelope detection circuit 62 (actually the difference between the detected peak voltages, as shown in FIG. 2), and then outputs the sum voltage as a signal S63 to the smoothing circuit 64.

The smoothing circuit 64 smooths the sum voltage S63 obtained from the adding circuit 63, and outputs the smoothed sum voltage as a signal S64 to the multiplying circuit 65.

As shown in FIG. 2, for example, the smoothing circuit 64 includes a low pass filter LPF which is composed of a resistance element R64 and a capacitor C64, and smooths the sum voltage by removing the high-frequency component superposed on the sum voltage.

The constant of the LPF is set to an adequate value adapted for operating the asymmetry correcting circuit at a desired speed.

The multiplying circuit 65 multiplies the sum voltage, which has been smoothed in the smoothing circuit 64, by a predetermined offset adjustment coefficient OFSTGAIN, and then outputs the result as differential signals S65a and S65b to the quantization reference voltage control circuit 66.

As shown in FIG. 2, for example, the multiplying circuit 65 includes a gm amplifier 651, a resistance element R651 connected between a first output of the gm amplifier 651 and a supply line of a power source voltage VDD, and a resistance element R652 connected between a second output of the gm amplifier 651 and the power source voltage VDD. In the gm amplifier 651, its mutual conductance gm is adjusted in response to the offset adjustment coefficient OFSTGAIN supplied from the register 9, for example, and then the gm amplifier 651 outputs the differential signals S65a and S65b based on the mutual conductance gm corresponding to the adjustment value.

The offset adjustment coefficient OFSTGAIN is set to an optimal value in relation to the offset quantity and the difference voltage between the positive and negative peak values. In this embodiment, this coefficient is set normally in a range of 0.2 to 0.3, for example.

This coefficient OFSTGAIN is controllable by a serial control register, an external terminal voltage or the like, and is settable to a desired value.

As will be described later, the differential signals S65a and S65b outputted from the multiplying circuit 65 are so corrected as to cancel out the error with respect to a desired expected value, by the analog correction signal fed back by a feedback gm DAC 8 for negative feedback.

In response to the bias voltage V10 supplied from the bias voltage source 10 and the differential signals S65a and S65b outputted from the multiplying circuit 65, the quantization reference voltage control circuit 66 shifts the median VRC of the quantization reference voltage of the ADC 7 DC-wise in accordance with the offset generated due to the asymmetry of the read signal (input signal), and controls the upper limit VRT and the lower limit VRB of the quantization reference voltage in accordance with the detected offset quantity.

As shown in FIG. 2, for example, the quantization reference voltage control circuit 66 includes a first adjusting circuit 661, a second adjusting circuit 662, a third adjusting circuit 663, a quantization reference voltage generating circuit 664, and voltage followers 665, 666 and 667.

The first adjusting circuit 661 subtracts the output differential signals S65a and S65b from the input bias voltage V10 supplied to the ADC 7, then shifts a zero reference voltage, which corresponds to the median VRC of the quantization reference voltage of the ADC 7, DC-wise in such a manner as to attain a coincidence with the zero crossing point of the read signal (input signal), and generates the upper limit of the quantization reference voltage on the basis of the result.

More specifically, as shown in FIG. 2, for example, the first adjusting circuit 661 includes a gm amplifier 6611 which is supplied with the output differential signals S65a and S65b of the multiplying circuit 65 at its differential input terminals and then amplifies the signals on the basis of a predetermined mutual conductance gm; an operational amplifier 6612 which is supplied with the first output of the gm amplifier 6611 at its non-inverting input terminal (+), also supplied with the bias voltage V10 from the bias voltage source 10 via a resistance element R6611, and further supplied with the first output of the gm amplifier 6611 at its non-inverting terminal (−) wherein the output of the amplifier 6612 is fed back via a resistance element R6612; and an operational amplifier 6613 which is supplied with the output signal of the operational amplifier 6612 at its non-inverting input terminal (+), and generates the upper limit voltage of the quantization reference voltage while the median of the quantization reference voltage generated in the quantization reference voltage generating circuit 664 is fed back thereto.

The second adjusting circuit 662 adjusts the upper limit VRT of the quantization reference voltage on the basis of the first adjustment quantity obtained through multiplication of the output differential signals S65a and S65b of the multiplying circuit 65 by a coefficient ASYMGT conforming with the correlation between the offset quantity of the read signal (input signal) and the asymmetric distortion quantity thereof, and then supplies the adjusted upper limit VRT to the ADC 7.

More specifically, as shown in FIG. 2, for example, the second adjusting circuit 662 includes a gm amplifier 6621 which is supplied with the output differential signals S65a and S65b of the multiplying circuit 65 at its differential input terminals, then amplifies the signals on the basis of the mutual conductance gm adjusted by the coefficient ASYMGT supplied thereto, and outputs a first differential adjustment signal; and an operational amplifier 6622 which is supplied with the first output of the gm amplifier 6621 at its non-inverting input terminal (+), and also supplied with the upper limit of the quantization reference voltage outputted from the operational amplifier 6613 via the resistance element R6621 while the output of the amplifier 6622 is fed back to its inverting input terminal (−) via the resistance element R6622, then adds the first adjustment signal to the upper limit of the quantization reference voltage outputted from the operational amplifier 6613, and supplies, to the ADC 7, the upper limit VRT of the quantization reference voltage adjusted in accordance with the offset quantity.

The third adjusting circuit 663 adjusts the lower limit VRB of the quantization reference voltage on the basis of a second adjustment quantity obtained through multiplication of the output differential signals S65a and S65b of the multiplying circuit 65 by a coefficient ASYMGB which conforms with the correlation between the offset quantity of the read signal (input signal) and the asymmetric distortion quantity thereof, and then supplies the adjusted lower limit VRB to the ADC 7.

More specifically, as shown in FIG. 2, for example, the third adjusting circuit 663 includes: a gm amplifier 6631 which is supplied with the output differential signals S65a and S65b of the multiplying circuit 65 at its differential input terminals, then amplifies the signals on the basis of the mutual conductance gm adjusted by the coefficient ASYMGB supplied thereto, and outputs a second differential adjustment signal; and an operational amplifier 6632 which is supplied with the first output of the gm amplifier 6631 at its non-inverting input terminal (+), and also supplied with the lower limit of the quantization reference voltage generated in the quantization reference voltage generating circuit 664 via a voltage follower 665 and a resistance element R6631, then adds the second adjustment signal to the lower limit of the quantization reference voltage while the output is fed back to its inverting input terminal (−) via a resistance element R6632, and supplies, to the ADC 7, the lower limit VRB of the quantization reference voltage adjusted in accordance with the offset quantity.

In this embodiment, as described above, the second adjusting circuit 662 and the third adjusting circuit 663 are given independent coefficients ASYMGT and ASYMGB respectively. These coefficients ASYMGT and ASYMGB are controllable by a serial control register, an external terminal voltage or the like, and may be set to desired values.

The quantization reference voltage generating circuit 664 includes resistance elements R6641, R6642, R6643, R6644 and a current source 1664 connected in series between the output line of the operational amplifier 6613 in the first adjusting circuit 661 and the reference potential (ground potential) GND.

The resistance values of the elements R6641 and R6644 are set to be three times the resistance values of the elements R6642 and R6643.

The quantization reference voltage generating circuit 664 generates an intermediate voltage, which is a reference level corresponding to +1 with respect to the zero reference voltage, at the junction of the resistance elements R6641 and R6642, and then supplies the generated intermediate voltage to the voltage follower 666. Subsequently the voltage follower 666 supplies, to the ADC 7, the intermediate voltage as a reference voltage VRTM corresponding to +1.

The quantization reference voltage generating circuit 664 also generates an intermediate voltage, which is a reference level corresponding to −1 with respect to the zero reference voltage, at the junction of the resistance elements R6643 and R6644, and then supplies the generated intermediate voltage to the voltage follower 667. Subsequently the voltage follower 667 supplies, to the ADC 7, the intermediate voltage as a reference voltage VRBM corresponding to −1.

The quantization reference voltage generating circuit 664 further generates a lower limit voltage of the quantization reference voltage at the junction of the resistance element R6644 and the current source 1664, and then supplies the lower limit voltage to the voltage follower 665.

The quantization reference voltage generating circuit 664 further generates a median voltage of the quantization reference voltage at the junction of the resistance elements R6642 and R6643, and then supplies the median voltage to the operational amplifier 6613 in the first adjusting circuit 661.

The ADC 7 receives the bias voltage V10 via the resistance element R10, then quantizes the input signal on the basis of the quantization reference voltage supplied from the quantization reference voltage generating circuit 664 in the asymmetry correcting circuit 6 and, after converting the quantized signal into digital data of predetermined bits (e.g., 6 bits), outputs the digital data to the data processing circuit 11 shown in FIG. 1.

Subsequently, the data processing circuit 11 executes, by an equalizer, for example, a predetermined process of equalization with regard to the digital data obtained from the ADC 7, and then decodes the data by a Viterbi decoder.

The data processing circuit 11 detects, after the PLL circuit 12 has been phase-locked, the offset error to at least the desired expected value on the basis of the digital data, and then outputs, to the DAC 8, a correction signal for canceling out the detected error.

The PLL circuit 12 generates, through its phase-locked loop, a clock signal CLK synchronized with the output data of the equalizer in the data processing circuit 11, and then supplies the clock signal CLK as sampling clock pulses to the ADC 7 or as timing clock pulses to the equalizer in the data processing circuit 11.

Next, the operation performed in the above structure will be described below.

First, a laser beam emitted from the optical pickup 1 is irradiated to a desired position on the optical disk DK, so that the recorded information is read out therefrom. The optical signal thus read out is converted into an electric signal and then is outputted as a read signal S1 to the RF amplifier 2.

In the RF amplifier 2, the read signal S1 obtained from the optical pickup 1 is amplified and so forth, and then the amplified read signal S2 is inputted to the AGC 3 via the AC coupling capacitor C1.

In the AGC 3, the amplitude of the AC-coupled read signal S2 after removal of its DC component through the capacitor C1 is adjusted, and the adjusted signal is outputted as a read signal S3 to the equalizer 4.

In the equalizer 4, a predetermined process of equalization is executed with regard to the read signal S3 while any high-frequency noise is eliminated therefrom, and then the result is outputted as a read signal S4.

The DC component of the read signal S4 outputted from the equalizer 4 is removed through the capacitors 5a and 5b, and then the AC component thereof is supplied as read signals S5a and S5b to the asymmetry correcting circuit 6 and the ADC 7.

The read signal S5a supplied to the asymmetry correcting circuit is inputted to the first envelope detection circuit 61, while the read signal S5b is inputted to the second envelope detection circuit 62.

In the first envelope detection circuit 61, the bias voltage is supplied thereto from the bias voltage source 10 via the resistance element R10 and, after removal of the DC component through the capacitor 5a, the positive peak envelope of the read signal waveform is detected and then is outputted as a signal S61 to the adding circuit 63.

In the second envelope detection circuit 62, the bias voltage is supplied thereto from the bias voltage source 10 via the resistance element R11 and, after removal of the DC component through the capacitor 5b, the negative peak envelope of the read signal waveform is detected and then is outputted as a signal S62 to the adding circuit 63.

In the adding circuit 63, a sum voltage is generated by adding the positive peak voltage obtained from the first envelope detection circuit 61 and the negative peak voltage from the second envelope detection circuit 62, and then the sum voltage is outputted as a signal S63 to the smoothing circuit 64.

In the smoothing circuit 64, the sum voltage obtained from the adding circuit 63 is smoothed and then is outputted as a signal S64 to the multiplying circuit 65.

To cancel the asymmetric distortion of the signal and to render the PLL circuit 12 lockable, a process is executed first for attaining a coincidence of the original zero crossing point of the input signal (read signal) with the zero reference voltage VRC of the ADC 7.

More specifically, the output signal S54 of the smoothing circuit 65 is multiplied by a desired coefficient OFSTGAIN in the multiplying circuit 65, and the differential signals S65a and S65b thereof are supplied to the quantization reference voltage control circuit 66.

In the quantization reference voltage control circuit 66 supplied with the differential signals S65a and S65b produced through multiplication by the coefficient OFSTGAIN, the output signal of the multiplying circuit 65 is subtracted from the bias voltage V10 of the ADC 7, so that the zero reference voltage VRC of the ADC 7 is adjusted.

In the structure of FIG. 2, feedback is applied by the operational amplifier 6613 of the first adjusting circuit 661 in such a manner as to attain a coincidence of the zero reference voltage VRC with the bias voltage V10 of the ADC 7, wherein the offset is adjusted by the adding circuit which includes the gm amplifier 6611 and the operational amplifier 6612.

In the first adjusting circuit 661, the upper limit of the quantization reference voltage is generated by the operational amplifier 6613, and then is supplied to the second adjusting circuit 662 and the quantization reference voltage generating circuit 664.

In the quantization reference voltage generating circuit 664, an intermediate voltage, which is a reference level corresponding to +1 with respect to the zero reference voltage, is generated at the junction of the resistance elements R6641 and R6642, and the intermediate voltage is supplied as a reference voltage VRTM corresponding to +1 in the VRC system to the ADC 7 via the voltage follower 666.

Also in the quantization reference voltage generating circuit 664, an intermediate voltage, which is a reference level corresponding to −1 with respect to the zero reference voltage, is generated at the junction of the resistance elements R6643 and R6644, and then is supplied via the voltage follower 667 to the ADC 7 as a reference voltage VRBM corresponding to −1.

The DVR system has four signal levels of ±1 and ±2 after equalization and sampling of the read signal, but at ±1 levels, the offset-corrected signal is not affected substantially by the asymmetry.

Therefore, the reference voltages VRTM and VRTB are kept fixed to the zero reference voltage.

In the quantization reference voltage generating circuit 664, a lower limit voltage of the quantization reference voltage is generated at the junction of the resistance element R6644 and the current source 1664, and then is supplied to the third adjusting circuit 663 via the voltage follower 665.

Further in the quantization reference voltage generating circuit 664, a median voltage of the quantization reference voltage is generated at the junction of the resistance elements R6642 and R6643, and then is supplied to the operational amplifier 6613 in the first adjusting circuit 661.

In the second adjusting circuit 662, the output differential signals S65a and S65b of the multiplying circuit 65 are multiplied by the coefficient ASYMGT conforming with the correlation between the offset quantity of the read signal (input signal) and the asymmetric distortion quantity thereof, whereby a first adjustment quantity is produced, then the upper limit VRT of the quantization reference voltage is adjusted on the basis of the first adjustment quantity, and the adjusted upper limit VRT is supplied to the ADC 7.

In the third adjusting circuit 663, the output differential signals S65a and S65b of the multiplying circuit 65 are multiplied by the coefficient ASYMGB conforming with the correlation between the offset quantity of the read signal (input signal) and the asymmetric distortion quantity thereof, whereby a second adjustment quantity is produced, then the lower limit VRB of the quantization reference voltage is adjusted on the basis of the second adjustment quantity, and the adjusted lower limit VRB is supplied to the ADC 7.

In the ADC 7 where the bias voltage V10 is applied via the resistance element R10, the input signal is quantized in accordance with the quantization reference voltage supplied from the quantization reference voltage generating circuit 664 in the asymmetry correcting circuit 6, then the signal is converted into digital data of predetermined bits (e.g., 6 bits), and the digital data are outputted to the data processing circuit 11.

In the data processing circuit 11, a predetermined process of equalization is executed by, e.g., an equalizer with regard to the digital data obtained from the ADC 7, and then the data after such equalization are decoded by a Viterbi decoder.

In addition, in the data processing circuit 11, after the PLL circuit 12 has been phase-locked, the offset error and the asymmetry error relative to at least a desired expected value are detected on the basis of the digital data, and correction signals for canceling out such errors are outputted to the DAC 8.

Thus, a process of canceling out the detected errors is executed in the multiplying circuit 65, and then the differential signals are supplied therefrom to the quantization reference voltage generating circuit 664.

Consequently, the offset and the asymmetry of the input signal are corrected with high precision.

Figure 3:
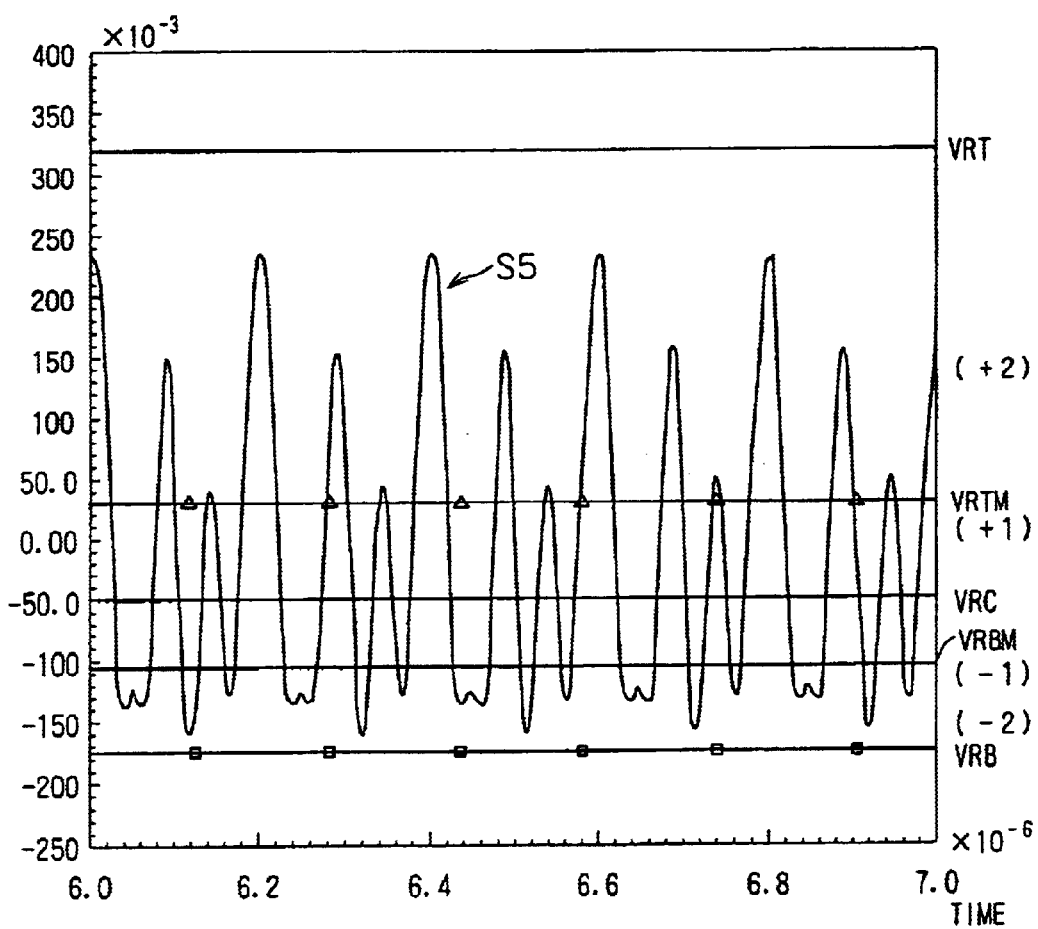
FIG. 3 graphically plots the waveform of operation observed at principal points in the asymmetry correcting circuit of the present invention shown in FIG. 2.

FIG. 3 graphically plots the waveform of operation observed at principal points in the asymmetry correcting circuit of the present invention shown in FIG. 2.

As is from FIG. 3, the upper limit value VRT, the positive intermediate value VRTM, the negative intermediate value VRBM and the lower limit value VRB of the quantization reference voltage are corrected satisfactorily in conformity with the offset quantity detected from the read signals S5a and S5b.

According to this embodiment, as described above, there is provided an improved asymmetry correcting circuit which includes: a first envelope detection circuit 61 for detecting the envelope of a positive peak of the input signal waveform; a second envelope detection circuit 62 for detecting the envelope of a negative peak of the input signal waveform; an adding circuit 63 for producing a sum voltage of the positive peak voltage obtained from the first envelope detection circuit 61 and the negative peak voltage obtained from the second envelope detection circuit 62; a smoothing circuit 64 for smoothing the sum voltage obtained from the adding circuit 63; a multiplying circuit 65 for multiplying the sum voltage, which has been smoothed in the smoothing circuit 64, by a predetermined offset adjustment coefficient; and a quantization reference voltage control circuit 66 for DC-wise shifting, in response to the output signal of the multiplying circuit 65, the median of the quantization reference voltage of the ADC 7 in conformity with the offset derived from the asymmetry of the input signal, and controlling the upper limit and the lower limit of the quantization reference voltage to the values that correspond to the offset quantity. Therefore, when the read signal is processed in the digital recording/reproducing apparatus, the quantization reference level of the ADC for digitizing the input signal can be changed asymmetrically in accordance with the asymmetry of the input waveform. Consequently, the asymmetry can be canceled simultaneously with the quantization, and the dynamic range of the ADC can be utilized effectively.

Since the control points are minimized to two points, it becomes possible to reduce the circuit scale as well. In the DVR system, a cyclic pattern including the run lengths of 2T3T5T may be written previously in the top portion of the data on the format, and the asymmetry quantity can be detected in the cyclic pattern.

In the initial training period, both the asymmetry and the offset of the quantized data can be canceled almost completely by the feed forward action, so that satisfactory pull-in for synchronism is rendered achievable in the PLL action.

After the PLL has been phase-locked, the errors are detected with high precision by processing the digital signal in the following stage, and negative feedback is applied by the feedback gm DAC and the resistor to consequently realize further exact correction of the offset and the asymmetry.

In this embodiment, there are four points for driving the ADC reference voltage. However, it is also possible to increase the number of such driving points to thereby enable the setting of any desired input-output characteristics of the ADC.

As explained hereinabove, according to the present invention where correction of the asymmetry is performed fundamentally through feed-forward, a fast operation can be ensured and, due to the nonnecessity of the digital signal processing, the PLL need not be phase-locked and therefore the operation is not affected by the PLL action.

Moreover, the dynamic range of the ADC can be utilized effectively by changing the upper limit VRT and the lower limit of the reference voltage thereof, so that it becomes possible to diminish the number of bits. In addition, since the asymmetry is corrected at the time of quantization in the ADC, the necessity of applying a load to the following digital signal processing stage can be eliminated to thereby reduce the circuit scale and the power consumption.

It is further possible to attain effective correction of such an asymmetry so that the ±1 levels generated in the DVR system are not varied substantially while only the ±2 levels are affected much to cause a vertically asymmetric distortion.

While a preferred embodiment of the present invention has been described using specific terms, such description is for illustrative purposes only, and it is to be understood that changes and variations may be made without departing from the spirit or scope of the following claims.

What is claimed is:

1. An asymmetry correcting circuit for correcting a vertically asymmetric distortion of an input signal waveform in an analog-to-digital converter which quantizes the input signal waveform in accordance with a quantization reference voltage and converts the quantized waveform into a digital signal of predetermined bits, said asymmetry correcting circuit comprising:

a first envelope detection circuit for detecting the envelope of a positive peak of the input signal waveform;

a second envelope detection circuit for detecting the envelope of a negative peak of the input signal waveform;

an adding circuit for outputting a sum voltage of the positive peak voltage obtained from said first envelope detection circuit and the negative peak voltage obtained from said second envelope detection circuit;

a multiplying circuit for multiplying the sum voltage, which is outputted from said adding circuit, by a predetermined offset adjustment coefficient; and a quantization reference voltage control circuit for shifting, in response to the output signal of said multiplying circuit, the median of the quantization reference voltage of said analog-to-digital converter DC-wise in conformity with the offset derived from the asymmetry of the input signal, and controlling the upper limit and the lower limit of the quantization reference voltage to the values that correspond to the offset quantity.

2. An asymmetry correcting circuit according to claim 1, wherein a predetermined bias voltage is supplied to said analog-to-digital converter, and said quantization reference voltage control circuit comprises:

a first adjusting circuit for subtracting the output signal of said multiplying circuit from the input bias voltage supplied to said analog-to-digital converter and DC-wise shifting a zero reference voltage, which is the median of the quantization reference voltage of said analog-to-digital converter, in such a manner that the zero reference voltage coincides with the zero crossing point of the input signal;

a second adjusting circuit for adjusting the upper limit of the quantization reference voltage on the basis of a first adjustment quantity obtained through multiplication of the output signal of said multiplying circuit by a coefficient conforming with the correlation between the offset quantity of the input signal and the asymmetric distortion quantity thereof; and a third adjusting circuit for adjusting the lower limit of the quantization reference voltage on the basis of a second adjustment quantity obtained through multiplication of the output signal of said multiplying circuit by a coefficient conforming with the correlation between the offset quantity of the input signal and the asymmetric distortion quantity thereof.

3. An asymmetry correcting circuit according to claim 2, wherein said second adjusting circuit and third adjusting circuit are given independent coefficients respectively.

4. An asymmetry correcting circuit according to claim 1, further comprising:

a digital processing circuit for detecting the offset error with regard to at least a desired expected value on the basis of digital data obtained from said analog-to-digital converter, and outputting a correction signal for canceling out the detected error; and a negative feedback circuit for applying, to said multiplying circuit, negative feedback of an analog signal corresponding to the correction signal obtained from said digital processing circuit.

5. An asymmetry correcting circuit according to claim 2, further comprising:

a digital processing circuit for detecting the offset error with regard to at least a desired expected value on the basis of digital data obtained from said analog-to-digital converter, and outputting a correction signal for canceling out the detected error; and a negative feedback circuit for applying, to said multiplying circuit, negative feedback of an analog signal corresponding to the correction signal obtained from said digital processing circuit.

6. An asymmetry correcting circuit according to claim 1, further comprising an AC connection means capable of removing the DC component of said input signal, then passing the AC component thereof, and inputting the AC component to said analog-to-digital converter, first envelope detection circuit and second envelope detection circuit.

7. An asymmetry correcting circuit for correcting a vertically asymmetric distortion of an input signal waveform in an analog-to-digital converter which quantizes the input signal waveform in accordance with a quantization reference voltage and converts the quantized waveform into a digital signal of predetermined bits, said asymmetry correcting circuit comprising:

a first envelope detection circuit for detecting the envelope of a positive peak of the input signal waveform;

a second envelope detection circuit for detecting the envelope of a negative peak of the input signal waveform;

an adding circuit for outputting a sum voltage of the positive peak voltage obtained from said first envelope detection circuit and the negative peak voltage obtained from said second envelope detection circuit;

a smoothing circuit for smoothing the sum voltage obtained from said adding circuit;

a multiplying circuit for multiplying the smoothed sum voltage, which is obtained from said smoothing circuit, by a predetermined offset adjustment coefficient; and a quantization reference voltage control circuit for shifting, in response to the output signal of said multiplying circuit, the median of the quantization reference voltage of said analog-to-digital converter DC-wise in conformity with the offset derived from the asymmetry of the input signal, and controlling the upper limit and the lower limit of the quantization reference voltage to the values that correspond to the offset quantity.

8. An asymmetry correcting circuit according to claim 7, wherein a predetermined bias voltage is supplied to said analog-to-digital converter, and said quantization reference voltage control circuit comprises:

a first adjusting circuit for subtracting the output signal of said multiplying circuit from the input bias voltage supplied to said analog-to-digital converter and DC-wise shifting a zero reference voltage, which is the median of the quantization reference voltage of said analog-to-digital converter, in such a manner that the zero reference voltage coincides with the zero crossing point of the input signal;

a second adjusting circuit for adjusting the upper limit of the quantization reference voltage on the basis of a first adjustment quantity obtained through multiplication of the output signal of said multiplying circuit by a coefficient conforming with the correlation between the offset quantity of the input signal and the asymmetric distortion quantity thereof; and a third adjusting circuit for adjusting the lower limit of the quantization reference voltage on the basis of a second adjustment quantity obtained through multiplication of the output signal of said multiplying circuit by a coefficient conforming with the correlation between the offset quantity of the input signal and the asymmetric distortion quantity thereof.

9. An asymmetry correcting circuit according to claim 8, wherein said second adjusting circuit and third adjusting circuit are given independent coefficients respectively.

10. An asymmetry correcting circuit according to claim 7, further comprising:
    a digital processing circuit for detecting the offset error with regard to at least a desired expected value on the basis of digital data obtained from said analog-to-digital converter, and outputting a correction signal for canceling out the detected error; and
    a negative feedback circuit for applying, to said multiplying circuit, negative feedback of an analog signal corresponding to the correction signal obtained from said digital processing circuit.

11. An asymmetry correcting circuit according to claim 8, further comprising:
    a digital processing circuit for detecting the offset error with regard to at least a desired expected value on the basis of digital data obtained from said analog-to-digital converter, and outputting a correction signal for canceling out the detected error; and
    a negative feedback circuit for applying, to said multiplying circuit, negative feedback of an analog signal corresponding to the correction signal obtained from said digital processing circuit.

12. An asymmetry correcting circuit according to claim 7, further comprising an AC connection means capable of removing the DC component of said input signal, then passing the AC component thereof, and inputting the AC component to said analog-to-digital converter, first envelope detection circuit and second envelope detection circuit.

13. An information reproducing apparatus for reproducing, as digital data, information recorded optically on an optical recording medium, comprising:
    an optical reading means for optically reading, from said optical recording medium, a signal corresponding to the recorded information;
    an analog-to-digital converter for quantizing the read signal waveform, which is obtained from said optical reading means, in accordance with a quantization reference voltage whose at least upper and lower limits are settable to desired values, and converting the quantized waveform into a digital signal of predetermined bits; and
    an asymmetry correcting circuit including:
        a first envelope detection circuit for detecting the envelope of a positive peak of said read signal waveform;
        a second envelope detection circuit for detecting the envelope of a negative peak of said read signal waveform;
        an adding circuit for outputting a sum voltage of the positive peak voltage obtained from said first envelope detection circuit and the negative peak voltage obtained from said second envelope detection circuit;
        a multiplying circuit for multiplying the sum voltage, which is outputted from said adding circuit, by a predetermined offset adjustment coefficient; and
        a quantization reference voltage control circuit for shifting, in response to the output signal of said multiplying circuit, the median of the quantization reference voltage of said analog-to-digital converter DC-wise in conformity with the offset derived from the asymmetry of the read signal, and controlling the upper limit and the lower limit of the quantization reference voltage to the values that correspond to the offset quantity;
        wherein said asymmetry correcting circuit is capable of correcting a vertically asymmetric distortion of the read signal waveform in said analog-to-digital converter.

14. An information reproducing apparatus according to claim 13, wherein a predetermined bias voltage is supplied to said analog-to-digital converter, and said quantization reference voltage control circuit comprises:
    a first adjusting circuit for subtracting the output signal of said multiplying circuit from the input bias voltage supplied to said analog-to-digital converter and DC-wise shifting a zero reference voltage, which is the median of the quantization reference voltage of said analog-to-digital converter, in such a manner that the zero reference voltage coincides with the zero crossing point of the read signal;
    a second adjusting circuit for adjusting the upper limit of the quantization reference voltage on the basis of a first adjustment quantity obtained through multiplication of the output signal of said multiplying circuit by a coefficient conforming with the correlation between the offset quantity of the read signal and the asymmetric distortion quantity thereof; and
    a third adjusting circuit for adjusting the lower limit of the quantization reference voltage on the basis of a second adjustment quantity obtained through multiplication of the output signal of said multiplying circuit by a coefficient conforming with the correlation between the offset quantity of the read signal and the asymmetric distortion quantity thereof.

15. An information reproducing apparatus according to claim 14, wherein said second adjusting circuit and third adjusting circuit are given independent coefficients respectively.

16. An information reproducing apparatus according to claim 13, further comprising:
    a digital processing circuit for detecting the offset error with regard to at least a desired expected value on the basis of digital data obtained from said analog-to-digital converter, and outputting a correction signal for canceling out the detected error; and
    a negative feedback circuit for applying, to said multiplying circuit, negative feedback of an analog signal corresponding to the correction signal obtained from said digital processing circuit.

17. An information reproducing apparatus according to claim 14, further comprising:
    a digital processing circuit for detecting the offset error with regard to at least a desired expected value on the basis of digital data obtained from said analog-to-digital converter, and outputting a correction signal for canceling out the detected error; and
    a negative feedback circuit for applying, to said multiplying circuit, negative feedback of an analog signal corresponding to the correction signal obtained from said digital processing circuit.

18. An information reproducing apparatus according to claim 13, further comprising an AC connection means capable of removing the DC component of said read signal, then passing the AC component thereof, and inputting the AC component to said analog-to-digital converter, first envelope detection circuit and second envelope detection circuit.

19. An information reproducing apparatus according to claim 13, further comprising:
an equalizing circuit for executing a predetermined process of equalization to the read signal; and
an AC connection means capable of removing the DC component of the read signal outputted from said equalizing circuit, then passing the AC component of said read signal, and inputting the AC component to said analog-to-digital converter, first envelope detection circuit and second envelope detection circuit.

20. An information reproducing apparatus for reproducing, as digital data, information recorded optically on an optical recording medium, comprising:
an optical reading means for optically reading, from said optical recording medium, a signal corresponding to the recorded information;
an analog-to-digital converter for quantizing the read signal waveform, which is obtained from said optical reading means, in accordance with a quantization reference voltage whose at least upper and lower limits are settable to desired values, and converting the quantized waveform into a digital signal of predetermined bits; and
an asymmetry correcting circuit including:
a first envelope detection circuit for detecting the envelope of a positive peak of said read signal waveform;
a second envelope detection circuit for detecting the envelope of a negative peak of said read signal waveform;
an adding circuit for outputting a sum voltage of the positive peak voltage obtained from said first envelope detection circuit and the negative peak voltage obtained from said second envelope detection circuit;
a smoothing circuit for smoothing the sum voltage obtained from said adding circuit;
a multiplying circuit for multiplying the smoothed sum voltage, which is outputted from said smoothing circuit, by a predetermined offset adjustment coefficient; and
a quantization reference voltage control circuit for shifting, in response to the output signal of said multiplying circuit, the median of the quantization reference voltage of said analog-to-digital converter DC-wise in conformity with the offset derived from the asymmetry of the read signal, and controlling the upper limit and the lower limit of the quantization reference voltage to the values that correspond to the offset quantity;
wherein said asymmetry correcting circuit is capable of correcting a vertically asymmetric distortion of the read signal waveform in said analog-to-digital converter.

21. An information reproducing apparatus according to claim 20, wherein a predetermined bias voltage is supplied to said analog-to-digital converter, and said quantization reference voltage control circuit comprises:
a first adjusting circuit for subtracting the output signal of said multiplying circuit from the input bias voltage supplied to said analog-to-digital converter and DC-wise shifting a zero reference voltage, which is the median of the quantization reference voltage of said analog-to-digital converter, in such a manner that the zero reference voltage coincides with the zero crossing point of the read signal;
a second adjusting circuit for adjusting the upper limit of the quantization reference voltage on the basis of a first adjustment quantity obtained through multiplication of the output signal of said multiplying circuit by a coefficient conforming with the correlation between the offset quantity of the read signal and the asymmetric distortion quantity thereof; and
a third adjusting circuit for adjusting the lower limit of the quantization reference voltage on the basis of a second adjustment quantity obtained through multiplication of the output signal of said multiplying circuit by a coefficient conforming with the correlation between the offset quantity of the read signal and the asymmetric distortion quantity thereof.

22. An information reproducing apparatus according to claim 21, wherein said second adjusting circuit and third adjusting circuit are given independent coefficients respectively.

23. An information reproducing apparatus according to claim 20, further comprising:
a digital processing circuit for detecting the offset error with regard to at least a desired expected value on the basis of digital data obtained from said analog-to-digital converter, and outputting a correction signal for canceling out the detected error; and
a negative feedback circuit for applying, to said multiplying circuit, negative feedback of an analog signal corresponding to the correction signal obtained from said digital processing circuit.

24. An information reproducing apparatus according to claim 21, further comprising:
a digital processing circuit for detecting the offset error with regard to at least a desired expected value on the basis of digital data obtained from said analog-to-digital converter, and outputting a correction signal for canceling out the detected error; and
a negative feedback circuit for applying, to said multiplying circuit, negative feedback of an analog signal corresponding to the correction signal obtained from said digital processing circuit.

25. An information reproducing apparatus according to claim 20, further comprising an AC connection means capable of removing the DC component of said read signal, then passing the AC component thereof, and inputting the AC component to said analog-to-digital converter, first envelope detection circuit and second envelope detection circuit.

26. An information reproducing apparatus according to claim 21, further comprising:
an equalizing circuit for executing a predetermined process of equalization to the read signal; and
an AC connection means capable of removing the DC component of the read signal outputted from said equalizing circuit, then passing the AC component of said read signal, and inputting the AC component to said analog-to-digital converter, first envelope detection circuit and second envelope detection circuit.

* * * * *